(12) United States Patent
Zhao et al.

(10) Patent No.: US 7,989,729 B1
(45) Date of Patent: Aug. 2, 2011

(54) DETECTING AND REPAIRING DEFECTS OF PHOTOVOLTAIC DEVICES

(75) Inventors: Guoheng Zhao, Milpitas, CA (US); George H. Zapalac, Jr., Santa Cruz, CA (US); Samuel S. H. Ngai, San Francisco, CA (US); Ady Levy, Sunnyvale, CA (US); Mehdi Vaez-Iravani, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 715 days.

(21) Appl. No.: 12/045,724

(22) Filed: Mar. 11, 2008

(51) Int. Cl.
*G01J 5/00* (2006.01)
*G06K 9/00* (2006.01)

(52) U.S. Cl. .......... 219/121.76; 219/121.83; 438/4; 204/157.15; 136/244; 136/252; 136/290; 382/141

(58) Field of Classification Search ......... 219/121.67–121.69, 121.72, 121.85, 219/121.76, 121.83; 136/243, 244, 252, 136/290; 324/501, 527; 438/4; 204/157.15; 382/141
See application file for complete search history.

(56) References Cited

U.S. PATENT DOCUMENTS

| | | | |
|---|---|---|---|
| 3,607,176 A * | 9/1971 | Milochevitch et al. ........ 65/32.2 |
| 4,166,918 A | 9/1979 | Nostrand et al. |
| 4,451,970 A | 6/1984 | Izu et al. |
| 4,464,823 A | 8/1984 | Izu et al. |
| 4,640,002 A * | 2/1987 | Phillips et al. ................... 438/12 |
| 4,680,616 A * | 7/1987 | Delahoy et al. .................. 257/62 |
| 4,749,454 A | 6/1988 | Arya et al. |
| 4,829,520 A * | 5/1989 | Toth .............................. 714/724 |
| 5,175,504 A * | 12/1992 | Henley ........................... 324/501 |
| 5,229,571 A * | 7/1993 | Neiheisel ................... 219/121.63 |
| 5,277,786 A | 1/1994 | Kawakami |
| 5,281,541 A | 1/1994 | Saito et al. |
| 5,290,986 A * | 3/1994 | Colon et al. ................... 219/770 |
| 5,320,723 A | 6/1994 | Kawakami |
| 5,976,978 A * | 11/1999 | Salisbury ...................... 438/690 |
| 6,046,429 A * | 4/2000 | Datta ........................ 219/121.69 |
| 6,225,640 B1 * | 5/2001 | Glenn et al. ............. 250/559.45 |
| 6,407,811 B1 * | 6/2002 | Snyder et al. ................. 356/316 |
| 6,423,595 B1 | 7/2002 | Beernink |
| 6,540,014 B2 * | 4/2003 | Getchel et al. ............... 165/80.1 |
| 6,541,754 B2 * | 4/2003 | Matsuyama ................ 250/214.1 |
| 6,576,831 B2 * | 6/2003 | Woditsch et al. ............. 136/258 |
| 6,610,960 B2 * | 8/2003 | De Steur et al. ......... 219/121.71 |
| 6,972,390 B2 * | 12/2005 | Hu et al. .................. 219/121.64 |
| 6,986,739 B2 * | 1/2006 | Warren et al. ................. 600/159 |
| 7,236,847 B2 * | 6/2007 | Marella ......................... 700/110 |
| 7,295,330 B2 * | 11/2007 | Chow ........................... 356/630 |
| 7,309,850 B2 * | 12/2007 | Sinton et al. ................ 250/203.4 |
| 7,553,670 B2 * | 6/2009 | Rakow et al. ................... 436/34 |
| 7,601,941 B2 * | 10/2009 | Fuyuki ........................ 250/214 R |
| 7,709,794 B2 * | 5/2010 | Zhao et al. ................. 250/338.1 |
| 7,788,629 B2 * | 8/2010 | Zurbrick et al. .............. 700/110 |
| 2005/0239365 A1 * | 10/2005 | Hiraoka ........................... 445/61 |
| 2006/0127729 A1 * | 6/2006 | Roscoe et al. .................. 429/34 |
| 2006/0169680 A1 * | 8/2006 | Park ......................... 219/121.68 |
| 2007/0056686 A1 * | 3/2007 | Choo et al. .................. 156/272.8 |
| 2008/0026232 A1 * | 1/2008 | Knerer et al. ................. 428/457 |
| 2009/0297017 A1 * | 12/2009 | Hudgings et al. ............. 382/141 |

* cited by examiner

*Primary Examiner* — Samuel M Heinrich
(74) *Attorney, Agent, or Firm* — Luedeka, Neely & Graham, P.C.

(57) ABSTRACT

An apparatus for both detecting and repairing a shunt defect in a solar cell substrate. A shunt detection module detects the shunt defect in the substrate, using at least one of lock-in thermography and current-voltage testing. A process diagnostic module determines whether the substrate should be passed without further processing by the apparatus, rejected without further processing by the apparatus, or repaired by the apparatus. A shunt repair module electrically isolates the shunt defect in the substrate. In this manner, a single apparatus can quickly check for shunts and make a determination as to whether the substrate is worth repairing. If it is worth repairing, then the apparatus can make the repairs to the substrate.

7 Claims, 16 Drawing Sheets

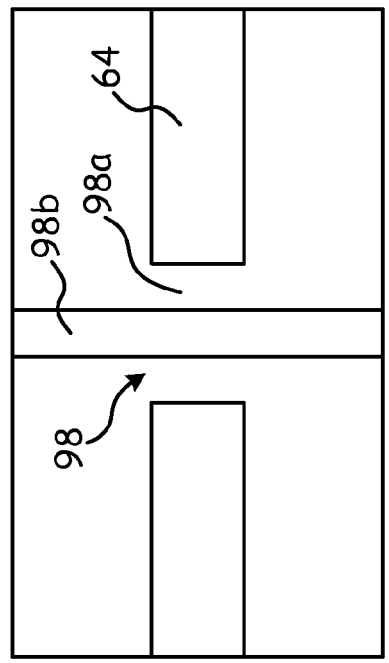
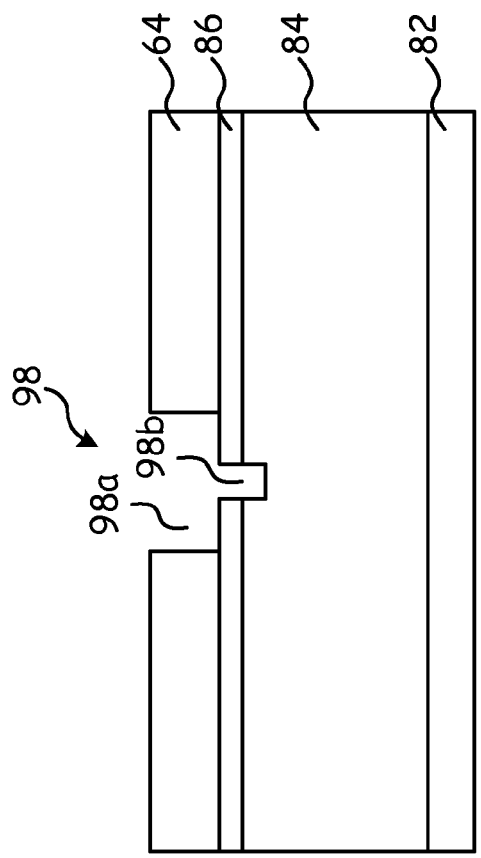
Fig. 13F
Fig. 13E

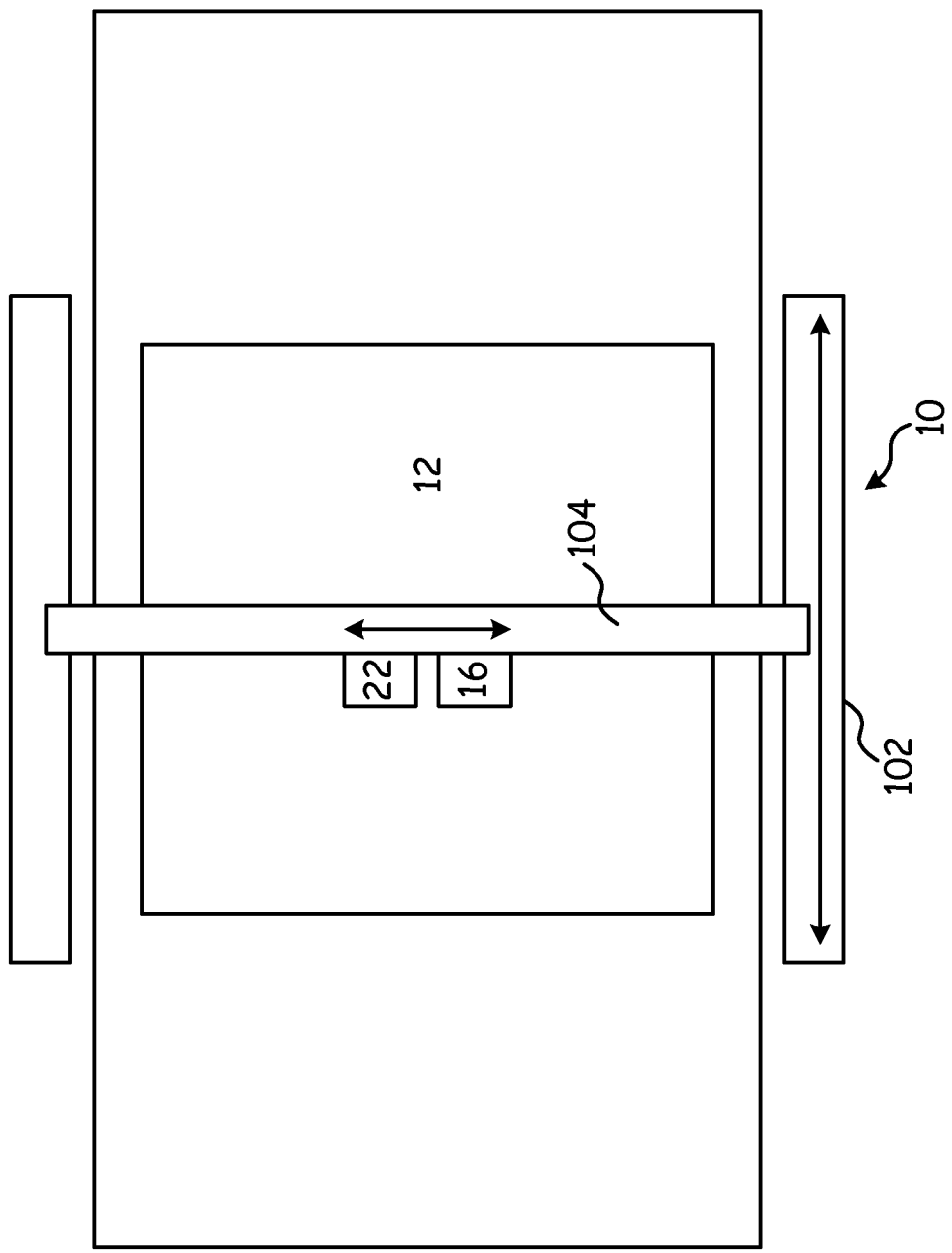

DETECTING AND REPAIRING DEFECTS OF PHOTOVOLTAIC DEVICES

FIELD

This invention relates to the field of photovoltaic cells. More particularly, this invention relates to reducing anomalies that tend to reduce the efficiency of photovoltaic cells.

BACKGROUND

Both silicon substrate and thin film solar cells can be affected by current leakage across the junction. This leakage is called "shunting," and it reduces the total amount of current that is available to be provided from the solar cell to the load, thereby reducing the efficiency of the solar cell.

A shunted cell can also be harmful when it is electrically connected in a series with other cells to create a module. Because the shunted cell produces less current than the other cells in the module, the shunted cell can become reverse-biased and dissipate an amount of power that can be almost equivalent to the power that is generated by one of the other cells. This power dissipation often causes localized heating or hot spots that can damage the entire module. Hence, solar cells with a low shunt resistance are generally discarded during fabrication, even when the efficiency remains satisfactory.

Shunting is caused by many different types of defects, and appears to be more prevalent in thin films and polycrystalline silicon substrates than in monocrystalline substrates. Although shunts are formed in a variety of ways, they fall into two broad electrical categories: ohmic shunts and weak diodes. Ohmic shunts are characterized by a low shunt resistance in the current-voltage curve for the cell, typically less than about eight ohms. Current leakage across the junction occurs under both forward and reverse biases. Weak diodes are characterized by a low open circuit voltage in the shunted region of the cell, as compared to the nominal open circuit voltage. Under illumination the weak diode region is forward biased by the surrounding area of the cell, causing current to flow in the wrong direction across the junction. Unlike ohmic shunts, weak diodes only demonstrate current leakage under forward bias.

Often the current leakage through the shunt is localized to relatively small regions on the surface or along the edge of the cell. A localized shunt may be screened by the sheet resistance of the top conductive layer. A shunt is screened when the current flowing across the resistive surface towards the shunt creates a voltage drop equal to the difference between the nominal voltage on the surface and the voltage above the shunt. The screening distance to the shunt is that distance across the top resistive surface that is required to create the measured voltage drop. Beyond the screening distance, current no longer flows towards the shunt. Hence a localized shunt effectively removes the region within the screening distance from the active area of the cell.

At low illumination, such as in the morning or evening hours, the screening distance becomes much greater and the degradation of the cell efficiency due to shunting is more serious. The effects described above are complicated when metal fingers have been formed on the surface of the solar cell, to reduce the series resistance of the cell. For example, if the shunt is electrically connected to a metal finger, then current can flow to the shunt from the entire cell. At a low enough shunt resistance, this type of defect may effectively short the entire cell and render it inoperable.

What is needed, therefore, is a system that overcomes problems such as those described above, at least in part.

SUMMARY

The above and other needs are met by an apparatus for both detecting and repairing a shunt defect in a solar cell substrate. A shunt detection module detects the shunt defect in the substrate, using at least one of lock-in thermography and current-voltage testing. A process diagnostic module determines whether the substrate should be passed without further processing by the apparatus, rejected without further processing by the apparatus, or repaired by the apparatus. A shunt repair module electrically isolates the shunt defect in the substrate. In this manner, a single apparatus can quickly check for shunts and make a determination as to whether the substrate is worth repairing. If it is worth repairing, then the apparatus can make the repairs to the substrate.

In various embodiments, at least one of a single-wavelength light emitting diode illumination source and a multi-wavelength light emitting diode illumination source provides illumination for at least one of the lock-in thermography and the current-voltage testing. Some embodiments include a chuck for receiving the substrate and for providing electrical contact to a back side of the substrate during at least one of the lock-in thermography, current-voltage testing, and shunt repair.

In some embodiments the shunt repair module includes a laser for inducing current in the substrate, and imaging means for determining a location of the shunt defect in the substrate during the inducing of the current. The shunt repair module in some embodiments uses a laser for forming an electrically nonconducting area around the shunt defect, thereby effectually electrically isolating the shunt defect from the substrate.

The current laser and the repair laser may alternately be the same laser or different lasers. If a single laser is used, then it is operated at a first relatively lower energy for inducing current in the substrate, and then at a second relatively higher energy for forming an electrically nonconducting area around the shunt defect. In some embodiments the electrically non-conducting area around the shunt defect is formed by at least one of melting a portion of the substrate around the shunt defect and ablating a portion of the substrate around the shunt defect. The repair laser in some embodiments melts a peripheral edge of substrate for substrate edge isolation and forms an identifying indicia on the substrate. In some embodiments non-metal portions of the substrate are rendered electrically nonconducting with a single pass of the laser and metal portions of the substrate a cut with multiple passes of the laser. In other embodiments metal portions of the substrate are ablated using at least one of a relatively wider laser beam and a defocused laser beam, and non-metal portions of the substrate are ablated using at least one of a relatively narrower laser beam and a focused laser beam.

In some embodiments the shunt repair module dispenses an electrically conductive paste for rerouting electrical connections on the substrate.

According to another aspect of the invention there is provided a method for repairing a shunt defect in a solar cell substrate. An initial inspection of the substrate is performed by at least one of (1) illuminating the substrate with light emitting diodes to induce a current in the substrate, and creating an image of the substrate with an infrared camera using lock-in thermography to detect the shunt defect as a bright spot in the image, or (2) passing a current through the substrate while sensing a voltage drop across the substrate to detect the shunt defect by an analysis of a current-voltage profile of the substrate. Based at least in part on the initial inspection of the substrate, it is then determined whether to reject the substrate, pass the substrate, or repair the substrate. A finer inspection of the substrate is performed by inducing a current in the substrate with a first laser beam and detecting the shunt defect when the first laser beam passes over the shunt defect. A second laser beam is used to effectually electrically isolate the shunt defect from the substrate.

In various embodiments according to this aspect of the invention, the step of effectually electrically isolating the shunt defect is accomplished by at least one of melting a portion of the substrate around the shunt defect and ablating a portion of the substrate around the shunt defect.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 13A-13F are a series of cross sectional and top plan views of a solar cell in which an isolation trench is being formed through a grid finger and into the silicon of the substrate according to an embodiment of the present invention.

FIG. 14 is a functional block diagram of an integrated defect detection and repair system according to an embodiment of the present invention.

DETAILED DESCRIPTION

The general purpose of the embodiments of the present invention is to provide a method and apparatus for detecting and repairing shunt defects in photovoltaic devices such as solar cells. The efficiency loss of a shunt can be recovered by electrically isolating the shunt. One embodiment of the apparatus and method is provided herein. Other embodiments are contemplated.

Overview

Figure 1:
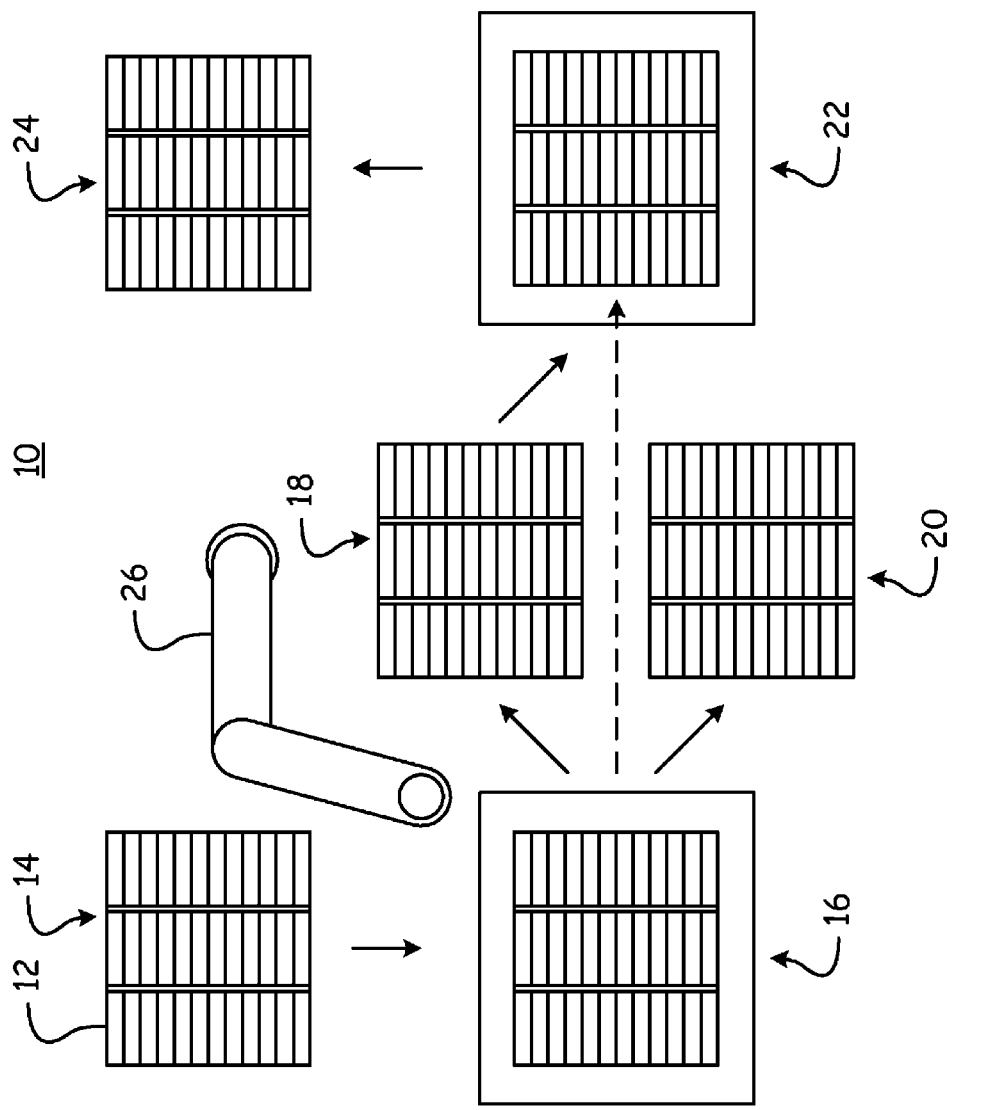
FIG. 1 is a functional block diagram of a modular defect detection and repair system according to an embodiment of the present invention.

The general construction of an apparatus 10 according to the present invention is depicted in FIG. 1. The apparatus 10 moves a photovoltaic substrate 12 from an input stack 14 of substrates 12 to a shunt detection module 16. Movement of the substrates 12 is performed in this embodiment by a robotic arm 26 with appropriate articulation and retention means. Substrates 12 that can be repaired of the defects found by the detection module 16 are placed in a buffer stack 18 of substrates 12, or moved directly to the repair module 22. Substrates 12 that cannot be repaired of the defects found by the detection module 16 are placed in a reject stack 20 of substrates 12. Substrates 12 are moved off of the buffer stack 18 to the repair module 22. After being repaired, the substrates 12 are moved to the repaired stack 24. Substrates 12 that have no defects can be moved directly from the detection module 16 to the repaired stack 24 of substrates 12, or alternately, could be placed on a stack of substrates 12 that have no defects, whether existing or repaired.

Detection Module

Figure 2:
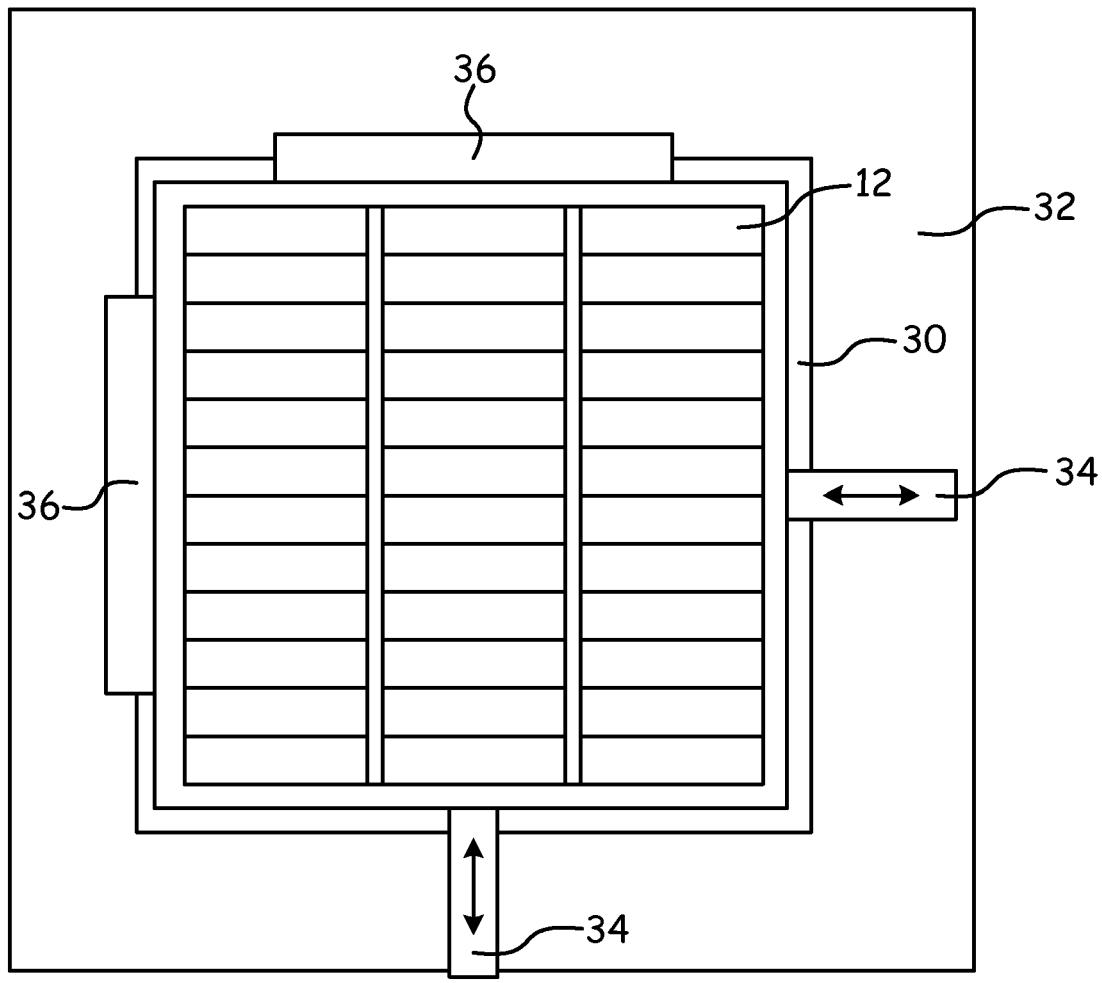
FIG. 2 is a top plan view of a substrate chuck according to an embodiment of the present invention.

The detection module 22 has two basic functions, optical inspection and electrical measurement, either one or both of which can be employed to detect defects in the substrate 12. Each of these two functions has specialized hardware associated with it, which specialized hardware is used while the substrate 12 resides on a common chuck 28. With reference now to FIG. 2, the chuck 28 is described. The chuck 28 on which the substrate 12 is mounted has two main parts. One part is an electrically conducting portion 30 that is in electrical contact with the backside of the substrate 12, and which has vacuum grooves to hold and flatten the substrate 12. The other part is an electrically insulating portion 32. The substrate 12 is aligned on the chuck 28 with mechanical means. In one embodiment, aligners 34 push from two sides of the substrate 12 against two stoppers 36 at the opposite sides of the substrate 12 and chuck 28.

Figure 3:
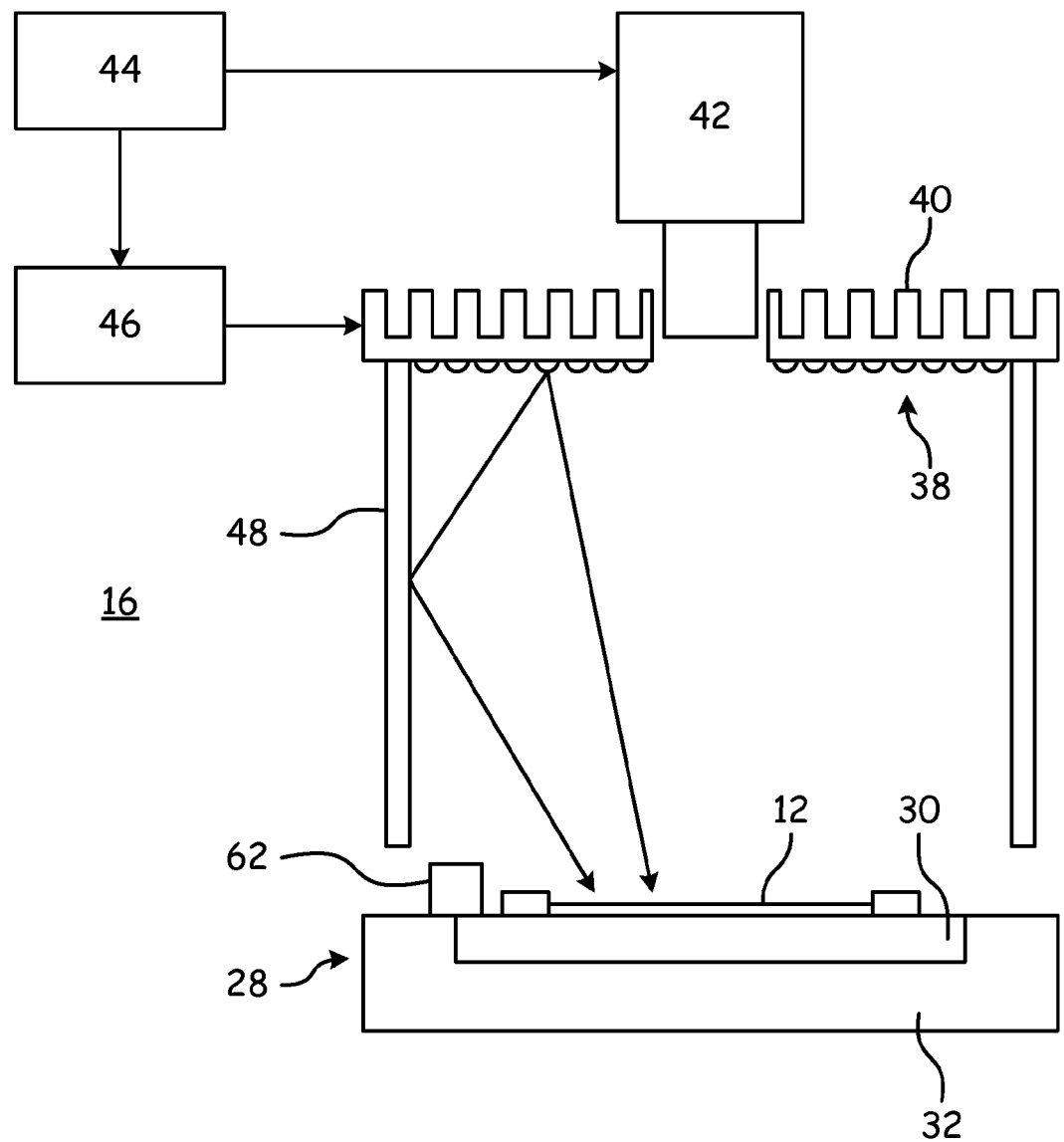
FIG. 3 is a functional block diagram of a detection module according to an embodiment of the present invention.

With reference now to FIG. 3, the inspection function of the detection module 16 is now explained. An illuminator 38 provides illumination to the substrate 12, such as with highly efficient light emitting diodes. Light emitting diodes are especially well suited for this application, because they exhibit a substantially instantaneous on/off, top-hat intensity pulse profile. Thus, light emitting diodes will tend to be more accurate than a flash lamp, and tend to not induce transient errors in the measurement to the same degree. A heat sink 40 is mounted to the back of the illuminator 38, so as to draw off heat from the illuminator 38. Light pipes 48 with mirrored inside surfaces help reflect the light from the illuminator 38 toward the substrate 12. The area of the illuminator 38 and the area bounded within the light pipes 48 are slightly larger than the size of the substrate 12. For example, for a six inch square substrate 12, the illuminator 38 is about eight inches square. An optical detector 62 may be used to sense the intensity of the illumination.

Figure 4:
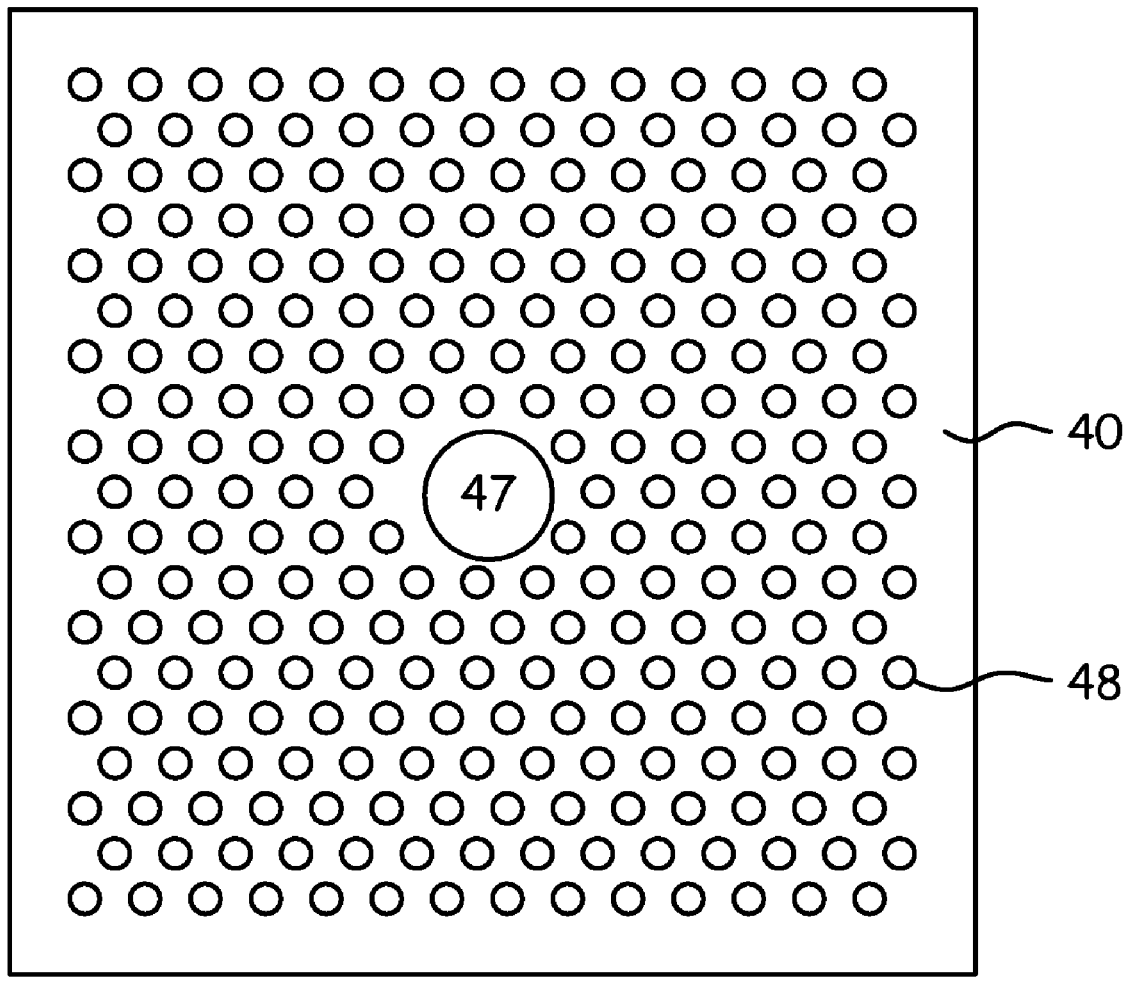
FIG. 4 is a plan view of an illuminator according to an embodiment of the present invention.

With reference now to FIG. 4, the illuminator 38 may, for example, consist of single-wavelength light emitting diodes 48 if a measurement of the absolute solar efficiency of the substrate 12 under an illumination of one Sun is not required. In this case, the longer wavelength of the spectrum (towards red and infrared) may be used to match the peak response of the solar cells and maximize the sensitivity to defects in the substrate 12. The illuminator 38, with the help of the recent advances in light emitting diode brightness, allows the equivalent of one Sun of illumination using a pulse operation.

Port 47 (see FIG. 4) through the illuminator 38 permits the substrate 12 to be viewed, such as with a camera 42 (see FIG. 3).

Figure 5:
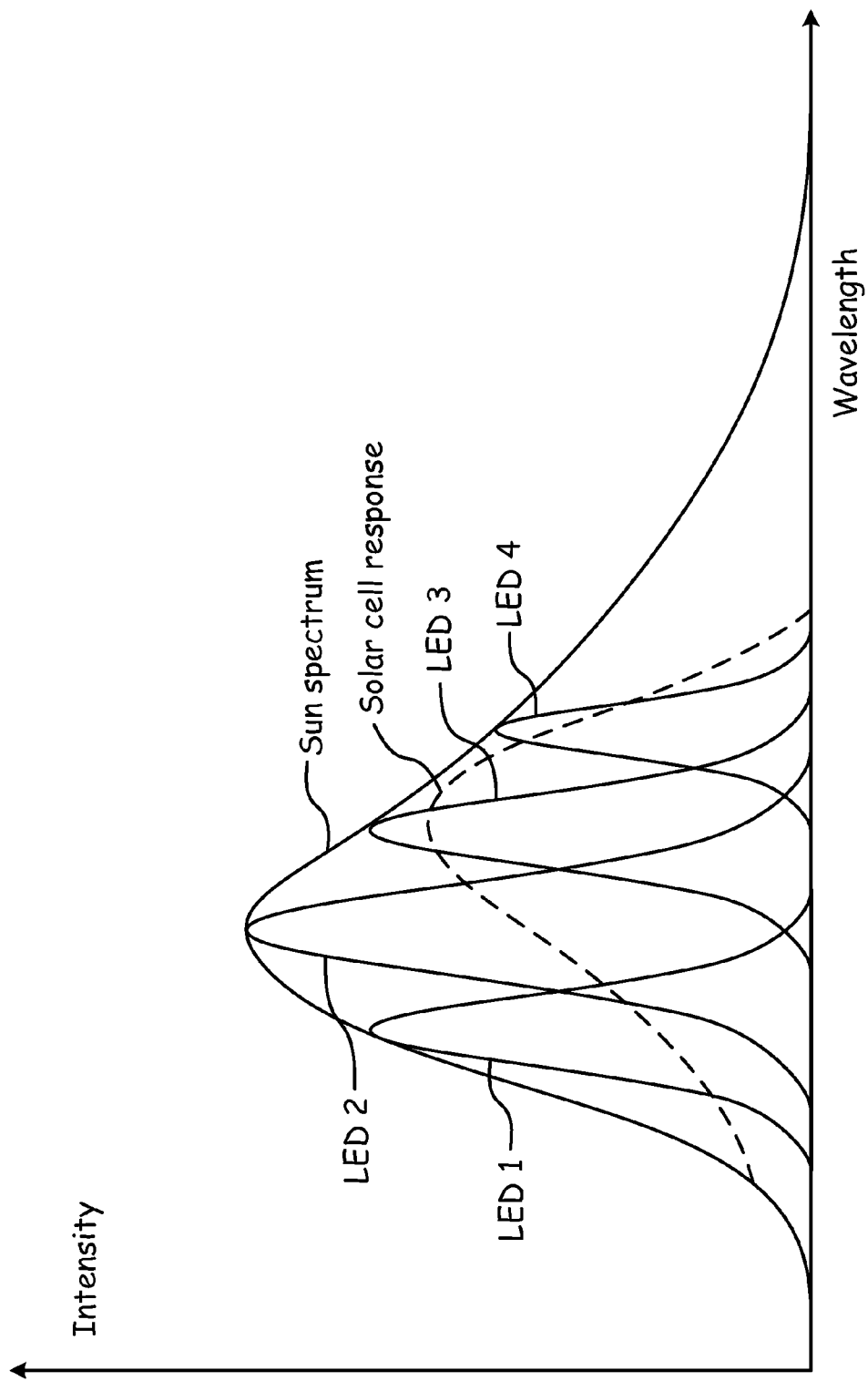
FIG. 5 is a graph of an illumination method according to an embodiment of the present invention.

If the measurement needs to simulate real-sun illumination, then light-emitting diodes 48 may still be used, although the diodes 48 will need to emit multiple wavelengths of illumination and be tuned with respect to wavelength and intensity to approximate the sun spectrum, as depicted in FIG. 5.

An alternate method can also be used to simulate one-Sun conditions, in which illumination at a single wavelength is used during the acquisition of the current-voltage curve, but the intensity of the illumination is adjusted to provide the same short circuit current that would be measured under standard one-Sun conditions. The value of this intensity depends upon both the solar illumination spectrum and the spectral response of the substrate 12. The solar spectrum is constant and may be retrieved from a database, but the spectral response of the substrate 12 must be measured. Generally this response is a very smooth function of wavelength, particularly for polysilicon or crystalline silicon solar cells.

Because the response function typically varies slowly, it may be sampled using only a few different wavelength light emitting diode 48 sources. Hence, the response curve may be reconstructed by performing separate current measurements at a small number of different wavelengths provided by light emitting diodes 48 with different wavelengths. Once the response curve has been so reconstructed, the appropriate intensity at a single wavelength is calculated so that the current-voltage measurement performed at this wavelength is equivalent to the current-voltage measurement taken under standard one Sun conditions. If a section of the response curve—for example near the band edge—is known to change more rapidly with wavelength than the remainder of the curve, then at least one of the light emitting diodes 48 should be chosen to illuminate within this more rapidly changing section of the curve.

Referring back again to FIG. 3, the illuminator 38 is directly modulated with an illumination driver 46 and synchronized with a camera 42, such as an infrared camera, to produce lock-in thermography images. Timing control circuit 44 is in communication with both the camera 42 and the illumination driver 46 to provide the synchronization between the camera 42 and the illuminator 38. The camera 42 acquires multiple frames (preferably more than four and an even number of frames) within one modulation cycle of the illuminator 38. The images are then Fourier filtered in the time domain to improve the signal to noise ratio, and then used to generate a defect map.

The inspection portion of the detection module 16 works by inducing a current in the substrate 12 using the illuminator 38. Wherever a current-shunting defect exists, the current tends to leak through the defect and heats up the defect. The camera 42, preferably an infrared camera, detects the heating of the defect. Thus, shunt defects in the substrate 12 are identified as hot spots (bright areas) in the lock-in thermography images.

Figure 6:
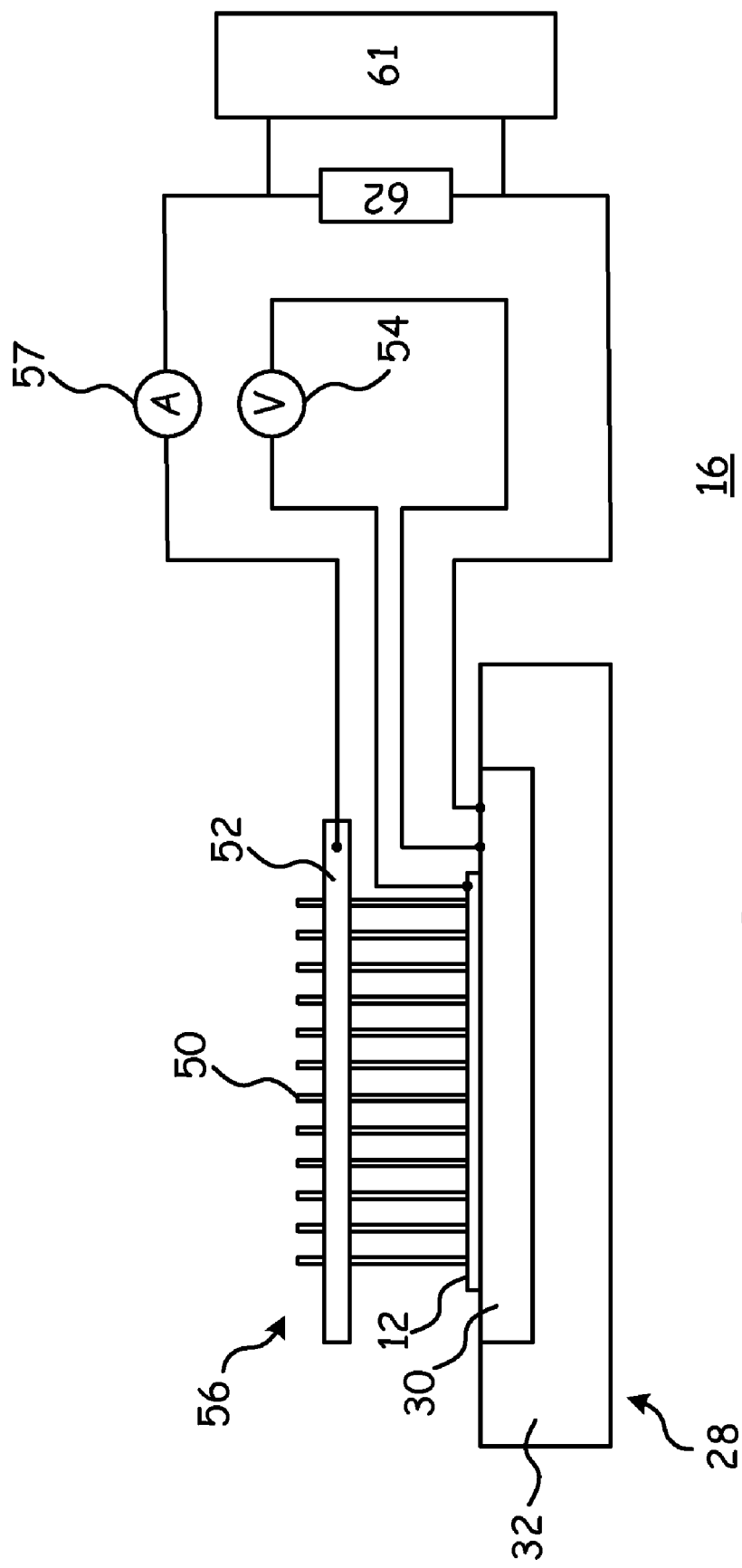
FIG. 6 is a functional block diagram of a current-voltage tester according to an embodiment of the present invention.

With reference now to FIG. 6, the current-voltage measurement function of the detection module 16 is depicted. The electrically conducting portion 30 of the chuck 28 serves as the back electrical contact for the current-voltage measurements. The current-voltage measurements are optionally conducted to measure a number of parameters, such as shunt resistance, serial resistance, short circuit current, open circuit voltage, and maximum power and efficiency under a specified illumination.

The current-voltage measurement is taken while the substrate 12 resides on the chuck 28. A typical six-inch square solar cell can generate about seven amperes of electrical current under one Sun of illumination, and has an open circuit voltage of around six-tenths of a volt. With such a large current, the combined resistance of the electrical contacts and the probe wires can severely distort the current-voltage measurements. For example, contact resistance of about one-tenth of an ohm causes a voltage drop of about seven-tenths of a volt, which is more than the open circuit voltage.

Thus, separate voltage measurement circuits 54 and bipolar power supply 61 are provided in the apparatus 10. Bipolar power supply 61 is used either as the current source that supplies current to the sample 12, or a current sink that draws current from sample 12. An ammeter or multimeter 57 measures the current flowing through sample 12. A voltmeter or multimeter 54 measures the voltage drop across sample 12, using a circuit that is independent from the circuit of current measurement. The voltage measurement circuit 54 has very high input impedance, and draws very little current. Therefore the effect of probe contact resistance is minimized.

Figure 7:
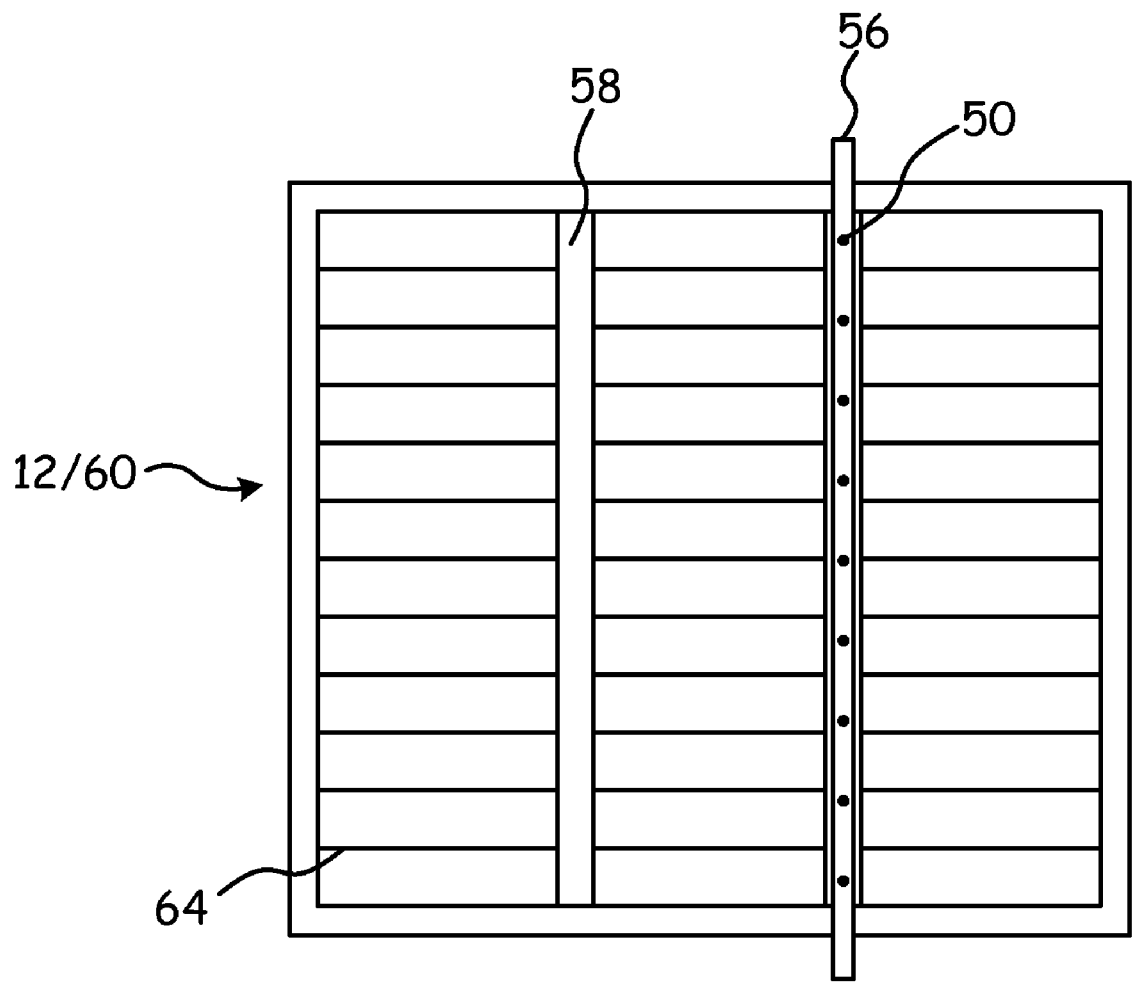
FIG. 7 is a top plan view of a substrate and probe assembly according to an embodiment of the present invention.

One end of the current supplying circuit 61 is also electrically connected to the electrically conductive part 30 of the chuck 28, thus providing a current path through the back side of the substrate 12. The other end of the current supplying circuit 61 provides a current path through the front side of the substrate 12, using an electrode assembly 56. The electrode assembly 56 includes an electrically conductive bus rod 52, to which are attached a plurality of spring loaded contact probes 50. The electrode assembly 56 is lowered toward the substrate 12 until the spring loaded contact probes 50 make electrical contact with the front side of the substrate 12, such as along a bus line 58 of the substrate 12, as depicted in FIG. 7. Two such electrode assemblies 56 are used to make electrical contact with the two bus lines 58 on the substrate 12, although as depicted in FIG. 7 only one such electrode assembly 56 is depicted.

Due to the large capacitance of the solar cells formed on the substrate 12 and their dependence on voltage, a delay is required between sourcing the current and sensing the voltage. The current source tends to be more stable due to the relationship between current and voltage across a capacitor (I=C(dV/dt)). However, the voltage measurement tends to be noisy for a good solar cell 60, for which the current-voltage curve is nearly flat when the voltage is much less than the open circuit voltage. To alleviate this condition, a resistor 62 may be electrically connected in parallel with the solar cell 60 to increase the slope of the current-voltage curve, as depicted in FIG. 6. The current diverted by the resistor 62 can be subtracted from the measurement. In addition, an adaptive sampling step may be used based on the slope of the current-voltage curve, so that the sampling along the current-voltage curve is more uniform. Alternately, voltage can be sourced instead of current in the flat part of the current-voltage curve.

Parameters such as the shunt resistance, serial resistance, short circuit current, open circuit voltage, maximum power, and efficiency can all be calculated for the solar cell 60 from the current-voltage curve, using known methods. These parameters and the lock-in thermography image are used to make a decision as to whether it is worthwhile to repair the substrate 12, or whether it should be rejected. The results of the detection module 16 can also be fed to process diagnosis tools to evaluate root cause yield issues.

The current measurement portion of the detection unit 16 detects shunt defects based on the current-voltage curve that is produced. Shunts tend to drain off current at a lower voltage than desired. Thus, a substrate 12 with excessive shunt defects will tend to have a current-voltage curve that tends to slope upward in a relatively gradual manner. On the other hand, a substrate 12 without excessive shunt defects will tend to have a current-voltage curve that remains relatively flat and horizontal until a given voltage is attained, at which point the current spikes upward in a substantially vertical profile. Thus, a good substrate 12 has more of a sharp corner at the transition voltage, and a bad substrate 12 has more of a rounded corner (or no corner at all) at the transition voltage.

When it is desired to only detect ohmic shunts 90 with very high current losses, a simple reverse bias with a small current, applied using the probes 50 of the current-voltage measurement apparatus, can quickly highlight ohmic shunts as viewed with the lock-in thermography imaging (weak diodes 90, however, cannot be detected in this manner, and weak diodes 90 might be providing most of the current losses). Only two infrared images need to be acquired in this case, one image with the current applied and the other image without any current applied. The difference between the two images will highlight those ohmic shunts that have the highest current losses. Either illumination from the illuminator 38 can be used, or a forward bias can be applied to the substrate 12, in this two-frame mode.

The calculated efficiency of the solar cell 60, either relative or absolute, serves as the baseline for the decision as to whether to repair the substrate 12. For example, if the substrate 12 is so laden with shunts 90 that, after it was fixed, it would not provide a desired level of power generation, then there would be no sense in repairing it. Other considerations include the amount of time required to fix the substrate 12. If the cost of the time on the machine or otherwise to fix the substrate 12 is too great, such as to remove a desirable level of profit from the sale of the solar cell 60, then it might be best to scrap the substrate 12 instead of repairing it. Thus, the decision as to whether to scrap or repair is preferably made in light of market conditions versus repair costs.

Information about the location of the shunts 90 that are detected in the detection module 16 can be transferred to the repair module 22. However, the detection module 16 is also suited to perform a relatively quick analysis of the substrate 12, to determine whether it needs any repair, and if so, if such repairs are worth performing.

Repair Module

Figure 8:
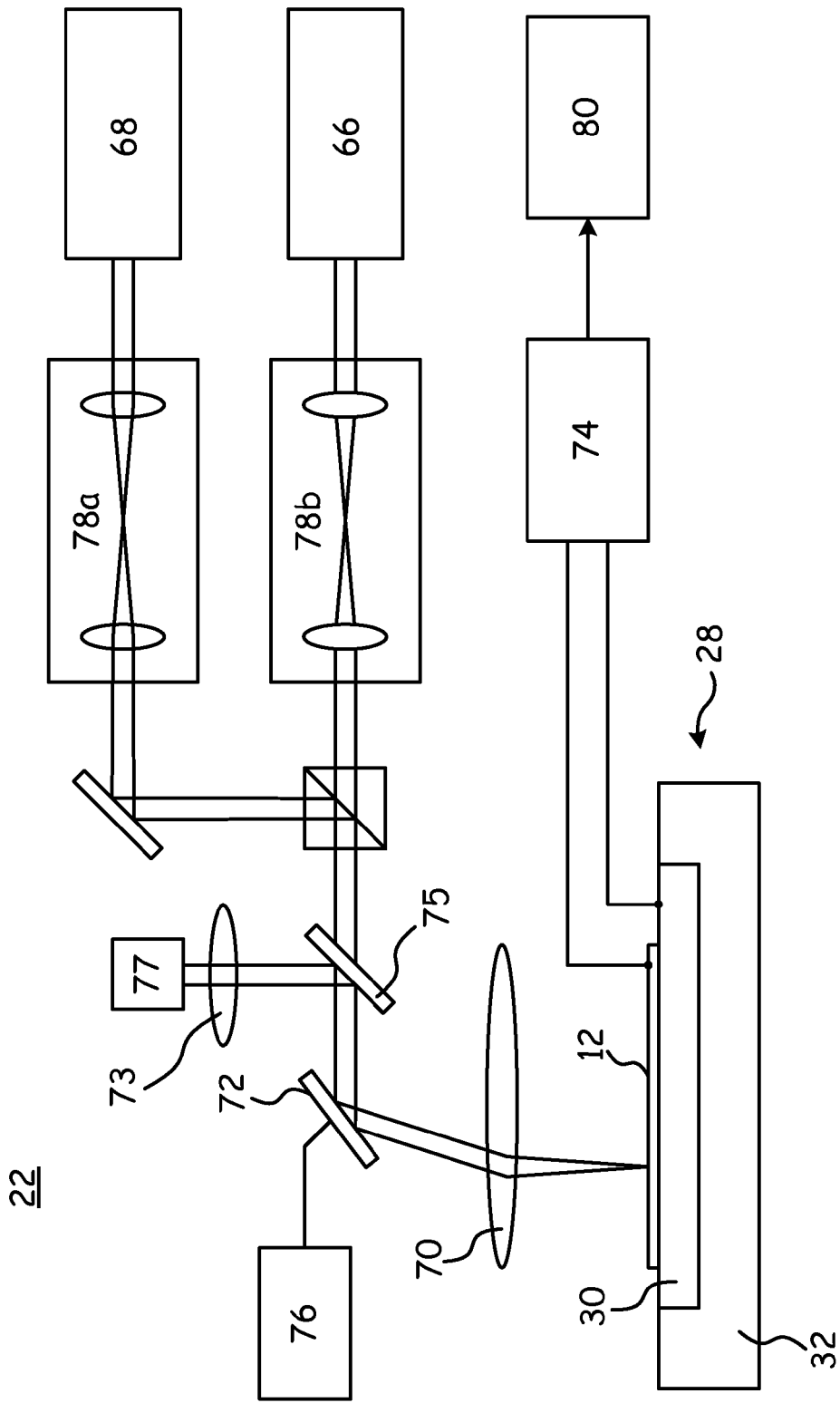
FIG. 8 is a functional block diagram of a repair module according to an embodiment of the present invention.

The repair module 22 is generally depicted in FIG. 8, and includes a high resolution laser beam induced current module that can further review and classify the shunt defects. The detailed laser beam induced current image is used to set up the repair parameters and geometry depending upon whether the defects are connected to grid fingers 64 (depicted in FIG. 7) or in the open areas of the substrate 12. After the repair, the substrate 12 is sent back to the detection module 16 to determine whether the repair was successful and to measure the efficiency of the substrate 12 after the repair.

The repair laser 66 is preferably a Q-switched laser. Various wavelengths can be used, from infrared to deep ultraviolet. The choice of wavelength depends on the materials to be processed. Repair is performed by cutting an isolating trench into the substrate 12 that surrounds the defect. The trench needs to be deep enough to cut through the PN junction to break the current path in the n+ layer to the shunt. For silicon based solar cells 60, the materials involved are either silicon or aluminum/silver paste. For these materials, a wide range of wavelengths can be used. Shorter wavelength lasers tend to generate better quality cut profiles, mainly due to better spot size and depth of focus. Diode pumped solid state lasers with frequency doubling outputs of 532 nanometers tend to be a good balance between cost and optical performance.

The repair laser 66 or a second laser just like it may be used at a much-reduced power to create a laser beam induced current in the substrate 12. However, a separate, low-power continuous wave laser is preferred to induce the current, which laser is referred to herein as the current laser 68. The continuous wave laser has a much better signal to noise ratio, and the data rate of scanning is not limited by the pulse repetition rate. The current laser 68 may operate at the same wavelength as the repair laser 66, such that the scan lens 70 does not need to be chromatic and can be of a lower cost. Multiple wavelengths from different lasers may be combined for the beam of the current laser 68, as the information of images of currents that are induced at different wavelengths can be valuable for process diagnosis.

As mentioned above, location information in regard to the shunts can be transferred from the detection module 16 to the repair module 22, if so desired in some embodiments. However, more accurate information in regard to the location of the shunts 90 is provided by the current laser 68. It is this location information that is used by the repair laser 66 in other embodiments. Thus, the current laser 68 is used as a review tool to image details of hot spots that are identified by the lock-in thermography images. The resolution of the lock-in thermograph image is typically limited by the thermal diffusion length, which is usually around a few hundred micrometers, at realistic modulation frequencies. The detail of the laser beam induced current image, however, is greater, and separates defects in the open area of the substrate 12 from those defects that are connected to the grid fingers 64, and can thus make repairs more efficient.

An XY galvanometric scan mirror 72 is used to position the repair laser 66 and the current laser 68. The scanning mirror 72 is controlled by a scanning controller 76. Spot size changer optics 78a and 78b are provided for the beam paths in some embodiments. Additional optics can also be provided for a variety of functions as known in the art.

Electrical contacts are made to both the bus line 58 on the front side of the substrate 12 (FIG. 7) and to the back side of the substrate 12 through the electrically conductive part 30 of the chuck 28. The electrical contacts are connected to a current amplifier 74 to collect the current signal that is generated at the scanning spot of the current laser 68. Signals from the current amplifier 74 can be sent to a data acquisition computer 80.

The reflected beams of the repair laser 66 and the current laser 68 are directed onto a photo detector 77 through a beam splitter 75 and a lens 73 to measure the reflectance of the substrate 12. In order to have the reflected laser spot remain stationary at the detector 77 while the incident laser spot scans across the entire substrate 12, scan lens 70 can be a telecentric lens, and scanning mirror 72 is positioned at the back focal point of scan lens 70. In addition, lens 73 images the surface of the scanning mirror 72 onto the surface of the detector 77. The thickness of the anti-reflectance coating of substrate 12 can be calculated from the reflectance measurements at a single wavelength or multiple wavelengths. The absorption coefficient can be derived from the reflectance measurement, and can be used to normalize the current measurements and therefore to derive the quantum efficiency of the substrate 12.

It is noted that the chuck 28 of the repair module may be the exact same chuck 28 as that used in the detection module 16, or it may be a separate but similarly-constructed chuck 28. When the same chuck 28 is used in both of the modules 16 and 22, then another mechanism can be used to move the chuck 28 between modules, rather than using the robotic arm 26. For example, an additional XY stage could be used to move the substrate 12 on the chuck 28. The combination of an XY stage with an XY galvanometric scanner 72 can achieve very high throughput for large substrates 12. A typical XY stage can move at a speed of about one meter per second, while a galvanometric mirror 72 can achieve more than ten times the scan speed. The combination of the XY stage with scanning mirror 72 takes full advantage of high speed positioning of a laser spot with the scanning mirror 72, and eliminates the throughput limitations due to the stop-and-go overhead time of a large XY stage.

Removing the Shunt

The lock-in thermography images (and optional laser beam induced current images) are first processed to define the desired location and geometry of the isolation trench that will be formed around the defect. Various algorithms, such as the threshold of the lock-in thermography signals, can be used to identify the defects to be removed, and the desired location and geometry of the isolation trench. A defect map may be overlaid on top of a raw infrared image, in which the grid fingers 64 can be identified, so that accidental disconnecting of the grid fingers 64 can be minimized.

Figure 9:
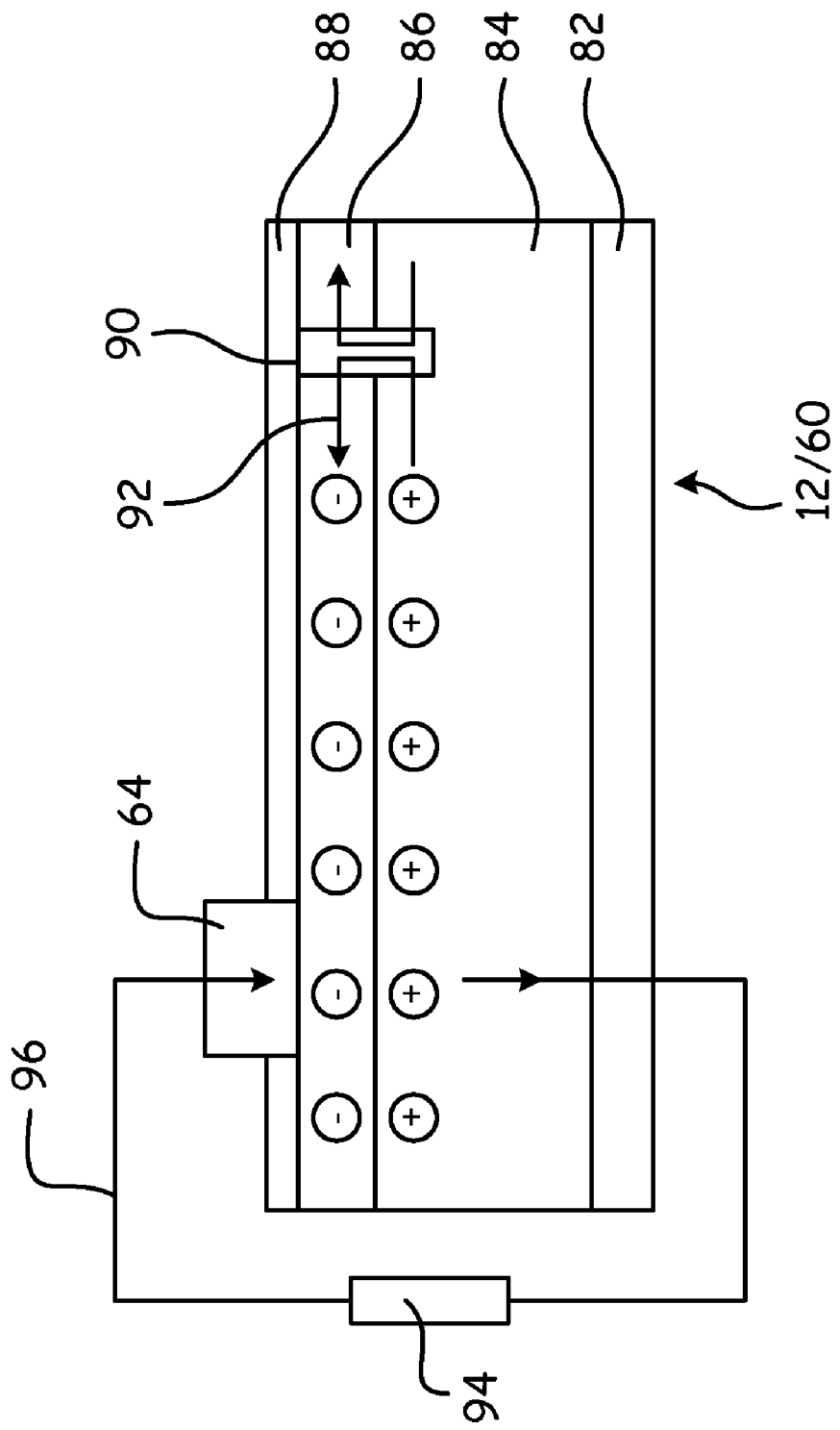
FIG. 9 is a functional block diagram of a solar cell and shunt.

Using the example of a silicon solar cell 60 substrate 12, the procedure for using the repair module 22 to repair the substrate 12 is now described. The procedure is applicable to solar cells 60 of the type depicted in FIG. 9. The substrate 12 has an electrically conductive back contact 82, against which is disposed a P doped substrate 84. On top of the P doped substrate 84 there is disposed an N or N+ doped layer 86. The top-most layer is an antireflective coating 88. Also formed on the substrate 12 are electrically conductive grid fingers 64, formed of a material such as metal. The N or N+ doped layer 86 is an electrically conductive pathway for current to the grid fingers 64.

The solar cell 60 normally operates by the photovoltaic creation of opposite charges developing along the interface of the N layer 86 and the P substrate 84. These charges are coupled through a circuit 96 to power an external load 94. However, a shunt defect 90 operates as an alternate current pathway 92 for the recombination of the opposite electrical charges at the interface, thus draining off the current that could otherwise be used to drive the external load 94, and thereby reducing the efficiency of the solar cell 60.

Figure 10:
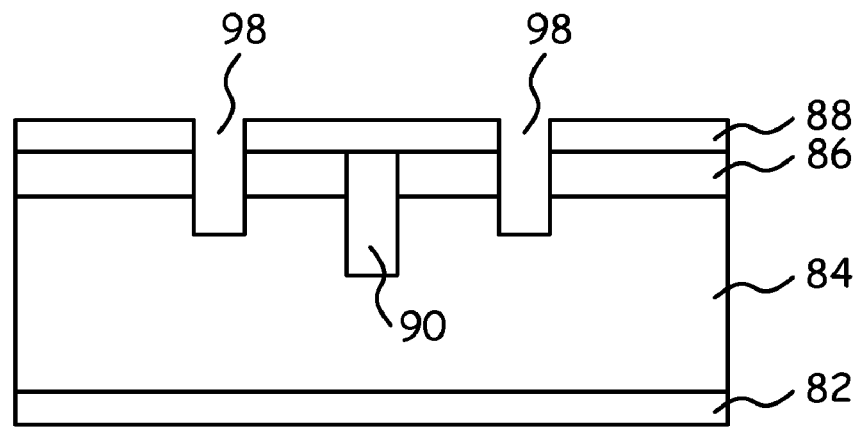
FIG. 10 is a cross sectional diagram of a solar cell, shunt, and isolation trench according to an embodiment of the present invention.
Figure 11:
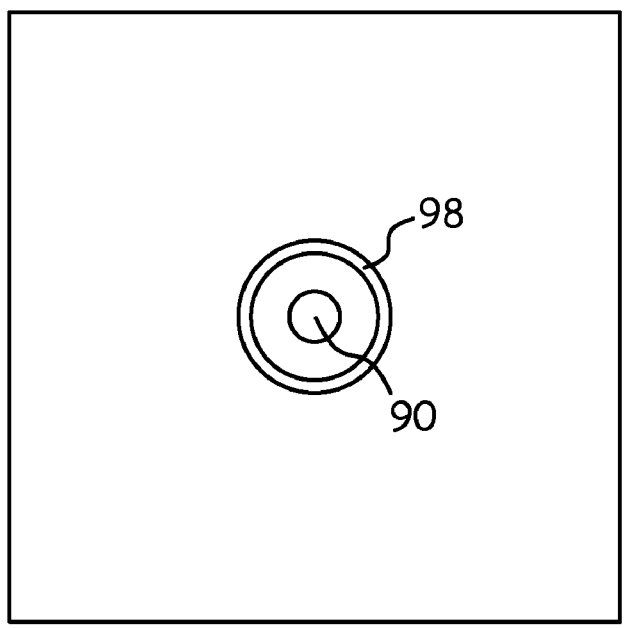
FIG. 11 is a top plan view of a solar cell, shunt, and isolation trench according to an embodiment of the present invention.

The shunt 90 is removed by cutting an isolating trench 98 around the shunt 90, such as with the repair laser 66, as depicted in FIG. 10 (cross sectional view) and 11 (top plan view). The isolating trench 98 needs to be deep enough to cut through the PN junction between the layers 84 and 86. Alternately, the shunt 90 is isolated without ablating a trench 98, but by other mechanisms such as melting and oxidizing of the top N layer. The repair laser 66 could also be used to mark the substrate 12 in some manner, such as with a bar code for tracking purposes.

Shunts 90 that abut or underlie the grid fingers 64 in some manner are much more damaging, because the grid fingers 64 have a much lower resistance than the N+ layer 86 and draw current from the entire solar cell 60. Therefore, the repair laser 66 needs to be able to cut across the metal grid fingers 64 to fix such shunts 90. This creates additional potential issues, including poor isolation from incomplete cuts and newly generated shunts 90 caused by metal re-deposition onto the side wall and bottom of the trench.

In some cases a single pass of the repair laser 66 can cut deep enough across the grid finger 64 to isolate the shunt 90. However, in general, lower energy and multiple passes of the repair laser 66 produces better results than a high-energy single-pass of the repair laser 66. The multi-pass method removes a smaller amount of material with each pass than does the single-pass method, but the subsequent passes help to clean out of the trench 98 any re-deposited material. In addition, for a Gaussian beam-spot profile, lower energy beams cut a narrower trench than higher energy beams, which generally lowers the probability that material will re-deposit back into the trench 98. In one embodiment, five passes were used for cutting a trench 98 across a grid finger 64, and one pass was used to cut a trench 98 in the silicon substrate 12. A Q-switched DPSS 532 nanometer repair laser 66 was used, using four watts of average power, a thirty kilohertz repetition rate, a seven nanosecond pulse width, and a twenty-five micrometer spot size.

Figure 12A:
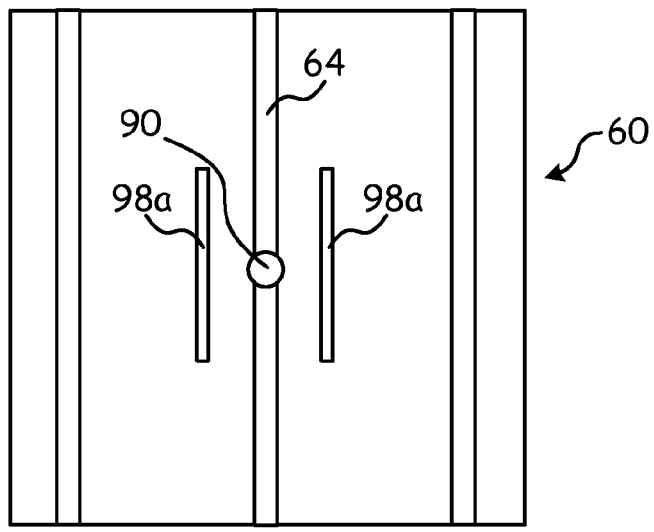
FIGS. 12A-12C are a series of top plan views of the formation of a combined single pass and multi-pass isolation trench and conductive bridge according to an embodiment of the present invention.
Figure 12B:
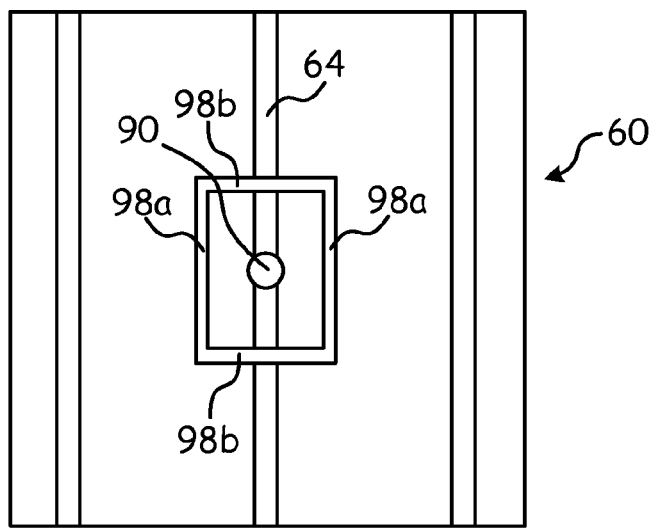

A method that combines these various types of cuts is graphically depicted in the top plan views of FIGS. 12A through 12B. As depicted in FIG. 12A, a shunt 90 is disposed under a grid finger 64. Two portions 98a of the isolation trench 98 are formed using a single pass each of the repair laser 66. With reference now to FIG. 12B, two additional portions 98b or the isolation trench 98 are formed using multiple passes of the repair laser 66, which completes the formation of the isolation trench 98. Alternately, a single pass of the repair laser 66 could be made on all sections 98a and 98b of the isolation trench 98, and then additional passes could be made just over those portions of sections 98b where the grid finger 64 is disposed.

Figure 12C:
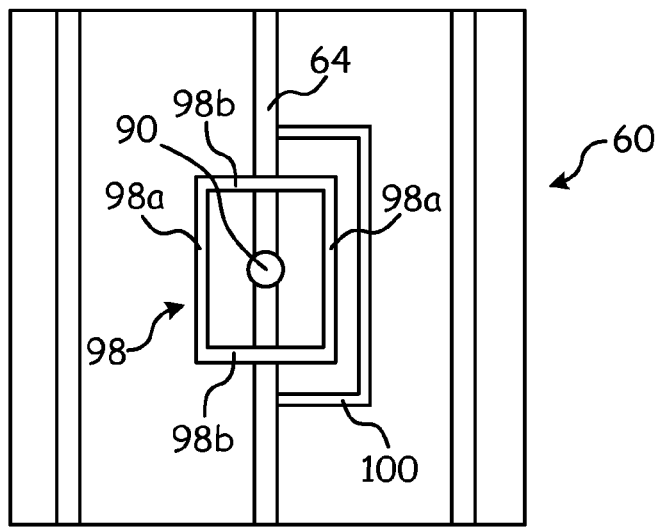

Depending upon the location of the cuts 98b across the grid finger 64, the disconnected ends of grid finger 64 may need to be re-connected, or connected to neighboring grid fingers 64, so that the loss of efficiency of the solar cell 60 brought about by the laser repair process can be reduced and preferably minimized. As depicted in FIG. 12C, a metal paste, such as silver paste, may be deposited in a bridge 100 to reconnect the ends of the grid fingers 64, either to each other or to other grid fingers 64. The repair laser 66 may be used to bake the silver paste 100, by firing the repair laser 66 into the silver paste 100 at an energy sufficient to bake the silver paste 100 but not sufficient to penetrate into the N+ layer 86 or otherwise damage the solar cell 60.

Figure 13B:
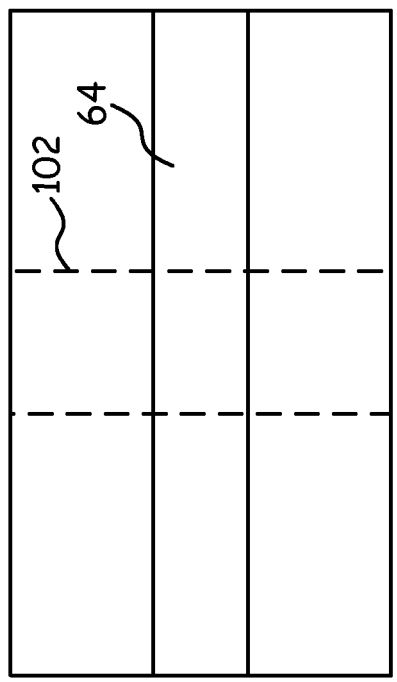
Figure 13A:
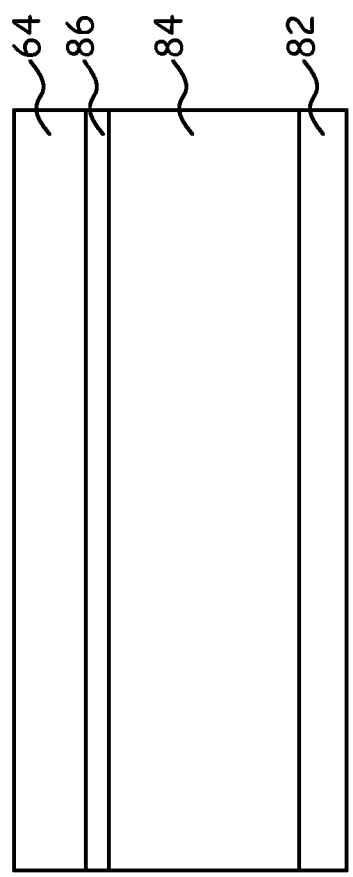
Figure 13D:
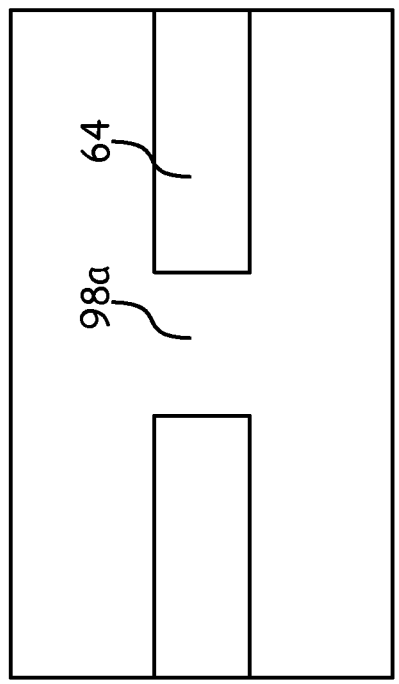
Figure 13C:
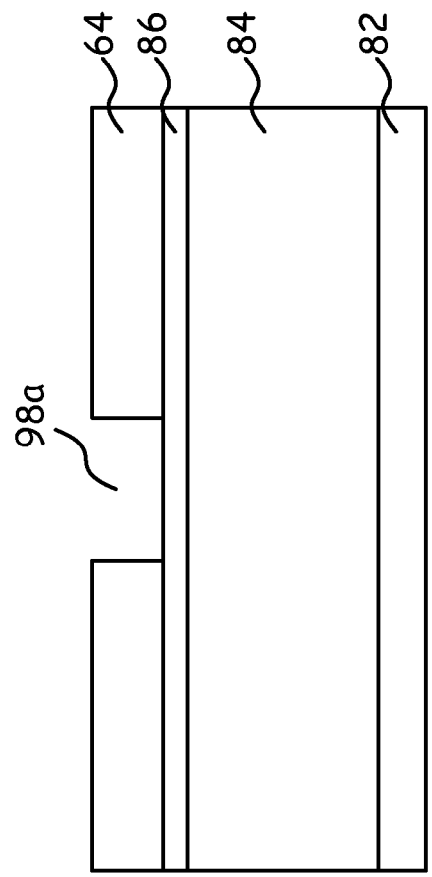

With reference now to FIGS. 13A-13F, there is shown another method of creating isolation trenches 98 when the trench 98 needs to cross a grid finger 64. FIG. 13A depicts a substrate 12 in cross-sectional view along a length of a grid finger 64. FIG. 13B depicts the substrate 12 in a top plan view, with a similar orientation. Section 102 is a portion of the substrate 12 where a trench 98 is to be formed, which section 102 passes across the grid finger 64. With reference now to FIG. 13C, a first portion 98a of the trench 98 has been formed by using a large spot or defocused repair laser 66 to trim away the material of the grid finger 64, typically metal, before cutting down into the other layers. FIG. 13D provides a top plan view of the results of that same step. FIGS. 13E and 13F depict the completion of cutting a second portion 98b of the trench 98 into the layers of the substrate 12 that underlie the grid finger 64. Removing the grid finger 64 in this two-step process reduces the risk of metal re-deposition into the completed trench 98.

The trench 98 has been depicted in the drawings as both a round continuous trench and a square continuous trench. It is appreciated that other perimeter geometries of the trench 98 are also contemplated, and various geometries might be preferred for some reason in different circumstances. It is also appreciated that trenches 98 formed of dots rather than continuous lines might be used in some circumstances, such as to minimize area loss of the solar cell 60, where such a trench 98 could still function to effectively isolate the shunt 90.

For solar cells 60 that are manufactured on substrates 12 that are larger than the optical field of view of the system 10 optics, the substrate 12 may be inspected and repaired one portion at a time by a relative motion of the system 10 with respect to the substrate 12. For example, in the embodiment of FIG. 14, the substrate 12 is placed on a surface, such as the chuck 28, and the detection module 16 and the repair module 22 are mounted on a gantry 104 that can scan back and forth across the surface of the substrate 12 in a first direction. The gantry 104 in this embodiment is mounted to a linear stage 102 that can scan back and forth along the length of the substrate 12 in a second direction, orthogonal to the first direction. In this manner, the entire surface of the substrate 12 can be inspected, one portion at a time, and the two modules 16 and 22 can be placed over a desired position of the substrate 12 to detect and then immediately repair shunts 90 as desired. This method could also be used when the solar cells 60 are formed in a continuous sheet of material that passes under the gantry 104.

It is also appreciated that more compartmentalized embodiments of the system 10 are also contemplated, where the detection module 16 and the repair module 22 are completely separate pieces of equipment.

Summary of the Method

The description of various aspects of a method according to the present invention has been generally given with the above description of the embodiments of the apparatus 10. However, with reference now to FIG. 15, a summary of one embodiment of the method according to the present invention is provided.

The method starts by loading a substrate 12 into the apparatus 10, as given in block 200. The substrate 12 is loaded into the detection module 16, and one or both of lock-in thermography or current-voltage testing is performed, as given in blocks 202 and 204, respectively. Information from the test or tests of the detection module 16 is delivered to a process diagnosis database or system 206. A decision as to whether to repair, scrap, or pass the substrate 12 is made in block 208. If the decision is to not repair the substrate 12, by either scrapping or passing the substrate 12, then control of the method falls to the binning block 222.

If the substrate 12 is to be repaired, then the substrate 12 is loaded into the repair module 22, where laser beam induced current imaging is performed, as given in block 210. The images produced with the current laser 68 provide higher resolution confirmation of the location of the shunts 90. Information from these images is provided to the process diagnosis database or system 206. The defect types are analyzed in block 212, based on the information gather on the substrate 12 so far, and repair parameters are determined, as given in block 214. For example, the type of isolation trench 98 to construct can be determined—whether it be a single pass, multi-pass, wide beam followed by narrow beam, melting beam instead of ablation beam, or dotted line.

Figure 15:
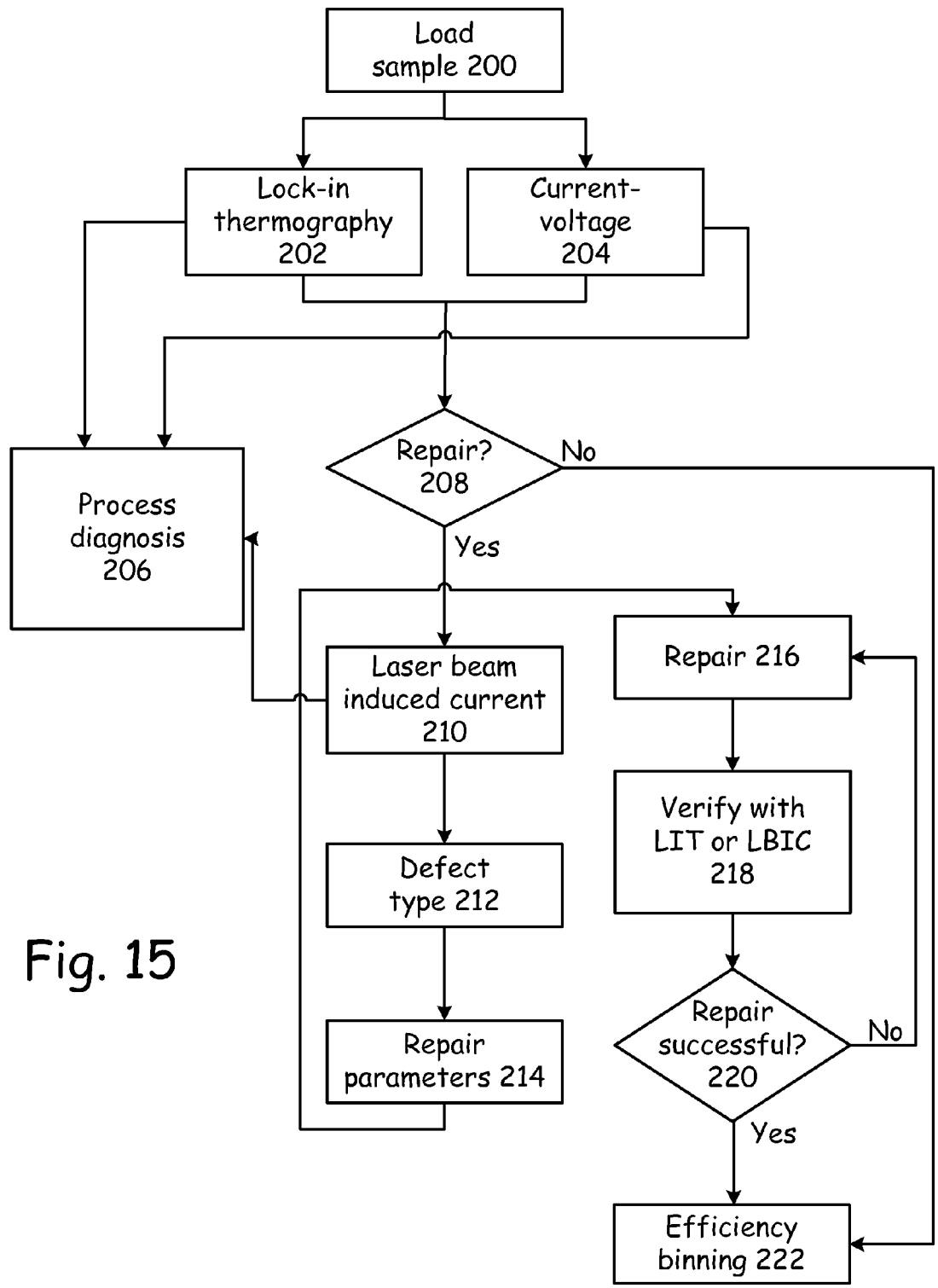
FIG. 15 is a flow chart of a defect detection and repair method according to an embodiment of the present invention.

These parameters are fed to the repair laser 66, and the repair as designed is performed as given in block 216. In the embodiment as indicated in FIG. 15, the repairs are verified using lock-in thermography imaging or laser beam induced current, as given in block 218. This could be accomplished by having such imaging available in the repair module 22, or by moving the substrate 12 back to the detection module 16. In some embodiments, the two modules 16 and 22 are only logically divided, and are physically present in the same module, chamber, or processing position. If the repairs are verified as being successful, then the decision is made in block 220 to pass the substrate 12 on to binning 222. If the repairs have not been successful, then the decision is made in block 220 to pass the substrate 12 back to the repair step 216. However, if it is determined that a substrate 12 is not responding well to repair, then it could be passed to binning 222 even though the repairs were not as successful as desired.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An apparatus for both detecting and repairing a shunt defect in a solar cell substrate, the apparatus comprising:
   a chuck for holding the substrate and providing electrical connection to a back side of the substrate,
   a shunt detection module for detecting the shunt defect in the substrate, the shunt detection module including,
      a lock-in thermography station having,
         a light emitting diode illumination source for providing illumination to the substrate, thereby inducing current in the solar cell, and
         an infrared camera for detecting the shunt defect,
   a process diagnostic module for determining whether the substrate should be one of passed without further processing by the apparatus, rejected without further processing by the apparatus, and repaired by the apparatus, based at least in part on results of the lock-in thermography, and
   a shunt repair module for locating and electrically isolating the shunt defect in the substrate, the shunt repair module having,
      a first laser set at a first relatively lower energy for inducing current in the substrate,
      an imaging means for determining a location of the shunt defect in the substrate during the inducing of the current, and
      a second laser set at a second relatively higher energy for forming an electrically nonconducting area around the shunt defect by at least one of melting a portion of the substrate around the shunt defect and ablating a portion of the substrate around the shunt defect.

2. The apparatus of claim 1, wherein the second laser additionally at least one of melts a peripheral edge of the substrate for substrate edge isolation and forms an identifying indicia on the substrate.

3. The apparatus of claim 1, wherein the shunt repair module further comprises a means for dispensing an electrically conductive paste for rerouting electrical connections on the substrate that have been rendered electrically nonconducting by the second laser, the second laser further for curing the electrically conductive paste that has been dispensed on the substrate.

4. The apparatus of claim 1, wherein non-metal portions of the substrate are rendered electrically nonconducting with a single pass of the second laser and metal portions of the substrate a cut with multiple passes of the second laser.

5. The apparatus of claim 1, wherein metal portions of the substrate are ablated using at least one of a relatively wider beam and a defocused beam of the second laser, and non-metal portions of the substrate are ablated using at least one of a relatively narrower beam and a focused beam of the second laser.

6. A method for repairing a shunt defect in a solar cell substrate, the method comprising the steps of:
- performing an initial inspection of the substrate by illuminating the substrate with light emitting diodes to induce a current in the substrate, and creating an image of the substrate with an infrared camera using lock-in thermography to detect the shunt defect as a bright spot in the image,
- determining based at least in part on the initial inspection of the substrate whether to one of reject the substrate, pass the substrate, and repair the substrate,
- performing a finer inspection of the substrate by inducing a current in the substrate with a first laser beam and detecting the shunt defect when the first laser beam passes over the shunt defect, and
- using a second laser beam to effectually electrically isolate the shunt defect from the substrate.

7. The method of claim 6, wherein the step of illuminating the substrate with light emitting diodes to induce a current in the substrate is accomplished by:
- illuminating the substrate with light emitting diodes that emit substantially a single wavelength of radiation at an intensity,
- adjusting the intensity to provide a short circuit current in the substrate, where the short circuit current has a level that is equal to a level of short circuit current that would be exhibited by the substrate when illuminated under standard one Sun conditions, where the level is determined by:
  - performing separate current measurements at different wavelengths of radiation emitted by light emitting diodes to construct a response curve, and
  - calculating the level of the illumination at the substantially single wavelength that produces a current-voltage measurement that is equivalent to the current-voltage measurement under standard one Sun conditions.

* * * * *